US010971604B2

(12) United States Patent
Leobandung

(10) Patent No.: US 10,971,604 B2
(45) Date of Patent: Apr. 6, 2021

(54) GATE ALL AROUND FIN FIELD EFFECT TRANSISTOR

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 21 days.

(21) Appl. No.: 15/839,122

(22) Filed: Dec. 12, 2017

(65) Prior Publication Data
US 2019/0181245 A1 Jun. 13, 2019

(51) Int. Cl.
H01L 29/00 (2006.01)
H01L 29/66 (2006.01)
H01L 29/78 (2006.01)
H01L 29/10 (2006.01)
H01L 29/161 (2006.01)
H01L 29/786 (2006.01)
H01L 29/423 (2006.01)

(52) U.S. Cl.
CPC .... *H01L 29/66795* (2013.01); *H01L 29/1033* (2013.01); *H01L 29/161* (2013.01); *H01L 29/42392* (2013.01); *H01L 29/6653* (2013.01); *H01L 29/6656* (2013.01); *H01L 29/66545* (2013.01); *H01L 29/66772* (2013.01); *H01L 29/785* (2013.01); *H01L 29/78654* (2013.01); *H01L 29/78696* (2013.01)

(58) Field of Classification Search
CPC ......... H01L 29/42392; H01L 29/66545; H01L 29/785
See application file for complete search history.

(56) References Cited

U.S. PATENT DOCUMENTS

| 8,994,081 | B2 | 3/2015 | Leobandung |
| 9,324,869 | B1 | 4/2016 | Yan et al. |
| 10,134,901 | B1* | 11/2018 | Pawlak ............... H01L 29/785 |
| 2016/0099344 | A1 | 4/2016 | Liu et al. |

FOREIGN PATENT DOCUMENTS

WO 2017/171761 10/2017

* cited by examiner

Primary Examiner — Mounir S Amer
Assistant Examiner — Alexander Belousov
(74) Attorney, Agent, or Firm — Tutunjian & Bitetto, P.C.; L. Jeffrey Kelly

(57) ABSTRACT

Semiconductor devices and methods of forming the same include forming a second dielectric layer on sidewalls of a channel region of a semiconductor fin. The semiconductor fin is surrounded at a fin base by a first dielectric layer. The first dielectric layer is recessed to form a gap in the channel region of the semiconductor fin between the first dielectric layer and the second dielectric layer. Material from the semiconductor fin is etched away at the gap to separate the semiconductor fin from an underlying surface in the channel region. A gate stack is formed in the channel region that completely encircles the semiconductor fin.

16 Claims, 7 Drawing Sheets

GATE ALL AROUND FIN FIELD EFFECT TRANSISTOR

BACKGROUND

Technical Field

The present invention generally relates to transistor fabrication and, more particularly, to fin field effect transistors having gate structures that wrap entirely around the channel fins.

Description of the Related Art

Fin field effect transistors (finFETs) can provide superior device scaling as compared to other transistor structures due to their dual/triple gate structure. However, the bottom portion of the channel in finFETs can suffer from short channel effects because the bottom portion is farther away from the gate structure.

SUMMARY

A method of forming a semiconductor device includes forming a second dielectric layer on sidewalls of a channel region of a semiconductor fin. The semiconductor fin is surrounded at a fin base by a first dielectric layer. The first dielectric layer is recessed to form a gap in the channel region of the semiconductor fin between the first dielectric layer and the second dielectric layer. Material from the semiconductor fin is etched away at the gap to separate the semiconductor fin from an underlying surface in the channel region. A gate stack is formed in the channel region that completely encircles the semiconductor fin.

A method of forming a semiconductor device includes forming dummy gates across a semiconductor fin. Gate spacers are formed on sidewalls of the dummy gates. The dummy gates are removed and a second dielectric layer is formed on sidewalls of a channel region of a semiconductor fin and on the gate spacers. The semiconductor fin is surrounded at a fin base by a first dielectric layer. The first dielectric layer is recessed to form a gap in the channel region of the semiconductor fin between the first dielectric layer and the second dielectric layer. Material from the semiconductor fin is etched away at the gap to separate the semiconductor fin from an underlying surface in the channel region. A gate stack is formed in the channel region that completely encircles the semiconductor fin.

A semiconductor device includes a channel region and source and drain regions. A gate stack is formed all around the channel region of the semiconductor fin, such that the channel region of the semiconductor fin is separated from the substrate. An interlayer dielectric is formed around the gate stack. At least a portion of the gate stack is formed in an undercut beneath the interlayer dielectric.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a gate-all-around fin field effect (finFET) structure. To accomplish this, a shallow trench isolation material is isotropically etched down to reveal a portion of the fins that can be etched away, leaving the channel portion of the fins suspended. When the gate structures are filled in, gate conductor material is deposited beneath the channel portion, such that no part of the channel is left isolated from the gate.

Figure 1:
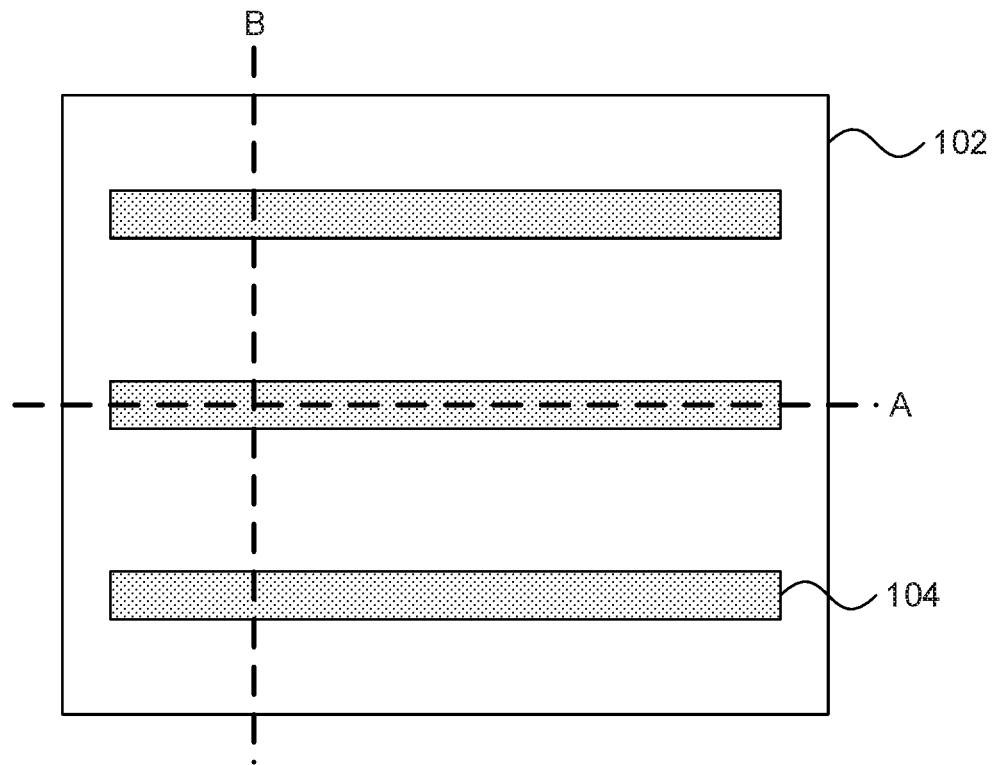
FIG. 1 is a top-down view of a step in the fabrication of gate-all-around fin field effect transistors (finFETs) in accordance with an embodiment of the present invention.

Referring now to the drawings in which like numerals represent the same or similar elements and initially to FIG. 1, a top-down view of a step in the formation of gate-all-around finFETs is shown. Cross sections A and B are shown and will be used in subsequent figures to illustrate structural features throughout the fabrication process.

A set of fins are formed from a semiconductor substrate 102. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium. Although not depicted in the present figures, the semiconductor substrate 102 may also be a semiconductor on insulator (SOI) substrate.

Alternative embodiments may employ a III-V compound semiconductor for the semiconductor substrate 102. The term "III-V compound semiconductor" denotes a semiconductor material that includes at least one element from Group III of the Periodic Table of Elements (i.e., International Union of Pure and Applied Chemistry (IUPAC) group 13) and at least one element from Group V of the Periodic Table of Elements (i.e., IUPAC group 15). This contrasts to group IV semiconductors which are formed from a single element in group IV of the Periodic Table of Elements (i.e., IUPAC group 14) such as, e.g., silicon, germanium, and compounds thereof. Typically, the III-V compound semiconductors are binary, ternary or quaternary alloys including III/V elements. Examples of III-V compound semiconductors that can be used in the present invention include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus, cadmium telluride, zinc selenide, and combinations thereof.

The fins may be formed by, e.g., depositing fin hardmasks 104 on the semiconductor substrate 102 and selectively anisotropically etching the material around the hardmasks 104 using, e.g., a reactive ion etch (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fin structures can be formed by sidewall imaging transfer (SIT).

In one example of a SIT process, a photoresist mandrel is first formed on a surface of the semiconductor material of the semiconductor substrate 102. Thereafter, a low-pressure chemical vapor (isotropic) deposition provides a dielectric profile on the sidewalls of the photoresist mandrel. The photoresist mandrel may then be removed using, for example, a chemical strip or selective etching. Following removal of the photoresist mandrel, the dielectric profile remains to provide an etch mask. The semiconductor material is then etched using the dielectric profile as an etch mask to provide the fin structures.

Figure 2:
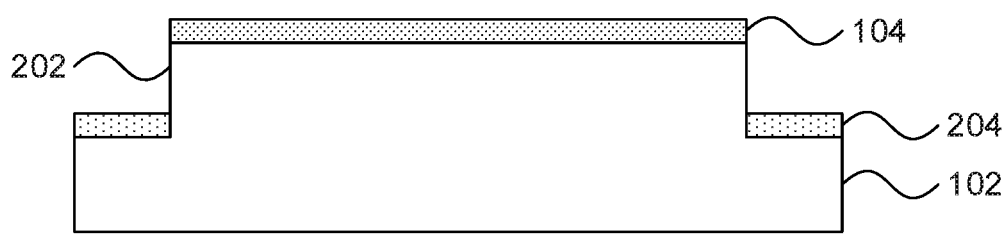
FIG. 2 is a view along cross-section A of a step in the fabrication of a gate all around finFETs where the fins are shown in accordance with an embodiment of the present invention.

Referring now to FIG. 2, a view along cross-section A of a step in the formation of gate-all-around finFETs is shown. After the fins 202 are formed by an appropriate anisotropic etch process, a shallow trench isolation material 204 is deposited around the fins 202. The shallow trench isolation material 204 may be, for example, silicon dioxide and may be formed by a spin-on process or any other appropriate deposition method. It is specifically contemplated that the shallow trench isolation material 204 may be formed to a thickness substantially less than the height of the fins 202, leaving sidewalls of the fins 202 exposed.

Figure 3:
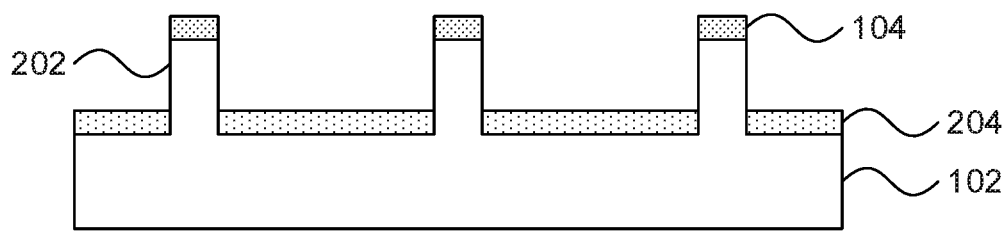
FIG. 3 is a view along cross-section B of a step in the fabrication of a gate all around finFETs where the fins are shown in accordance with an embodiment of the present invention.

Referring now to FIG. 3, a view along cross-section B of a step in the formation of gate-all-around finFETs is shown. In this view the cross-section of the fins 202 is visible with surfaces in-between being covered by the shallow trench isolation material 204. It should be understood that, although three fins 202 are shown in the present embodiments, any number of fins 202 may be used instead.

Figure 4:
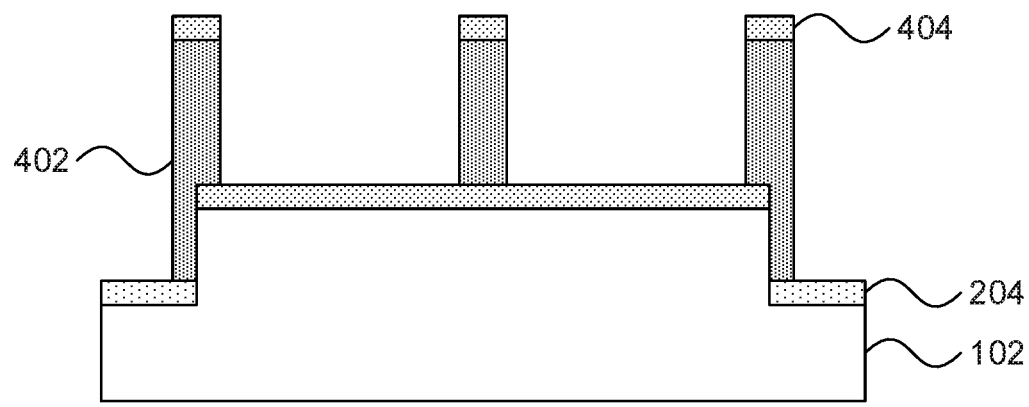
FIG. 4 is a view along cross-section A of a step in the fabrication of a gate all around finFETs where dummy gates are formed in accordance with an embodiment of the present invention.

Referring now to FIG. 4, a view along cross-section A of a step in the formation of gate-all-around finFETs is shown. Dummy gate structures 402 are formed by, e.g., depositing a dummy gate material such as polysilicon, depositing a dummy gate hardmask 104, and then anisotropically etching away any dummy gate material not covered by the dummy gate hardmask 104. It is understood that a dummy gate oxide (not shown) such as silicon dioxide can also be deposited before the dummy gate deposition. In this embodiment, three dummy gates 402 are formed. The central dummy gate 402 covers a channel region of the fin 202, while the peripheral dummy gates 402 cover the ends of the fin 202.

Figure 5:
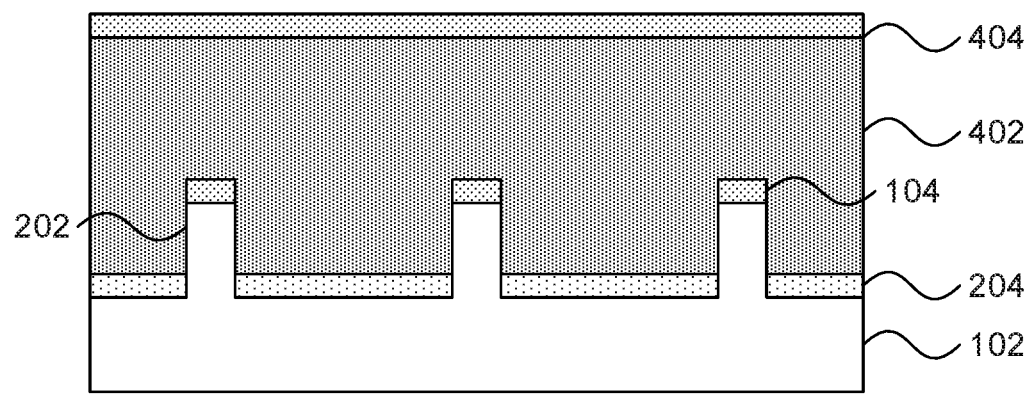
FIG. 5 is a view along cross-section B of a step in the fabrication of a gate all around finFETs where dummy gates are formed in accordance with an embodiment of the present invention.

Referring now to FIG. 5, a view along cross-section B of a step in the formation of gate-all-around finFETs is shown. This view is parallel to the length of the dummy gates 402 and shows how each dummy gate 402 can stretch across multiple fins 202.

Figure 6:
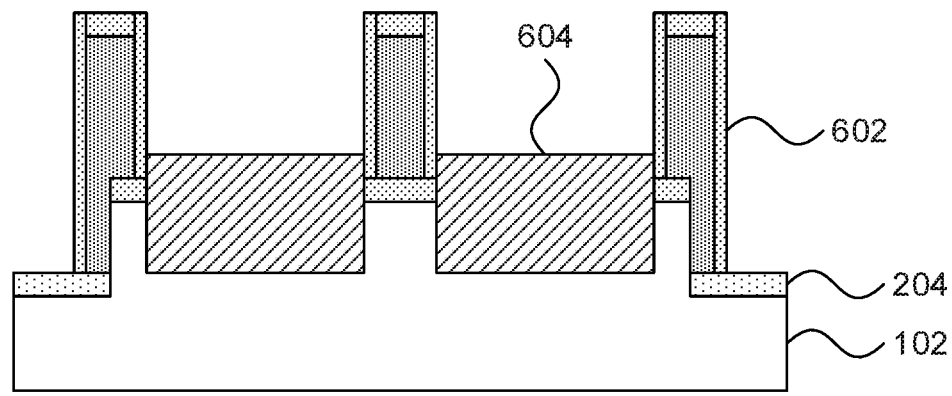
FIG. 6 is a view along cross-section A of a step in the fabrication of a gate all around finFETs where source and drain regions are formed in accordance with an embodiment of the present invention.

Referring now to FIG. 6, a view along cross-section A of a step in the formation of gate-all-around finFETs is shown. Gate spacers 602 are deposited on the sidewalls of the dummy gates 402 by any conformal deposition process. It is specifically contemplated that the gate spacers 602 may be formed from silicon nitride, though any other appropriate dielectric material may be used in its place.

Source and drain regions 604 are then formed on the exposed portions of the fins 202 after the fin hardmask material 104 is removed from those regions. The source and drain regions 604 may be formed by epitaxial growth from the bare semiconductor material of the fins 202, for example with in situ doping, or may alternatively be formed by implantation by an appropriate dopant.

Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. The specific dopant that is added will be either p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 7:
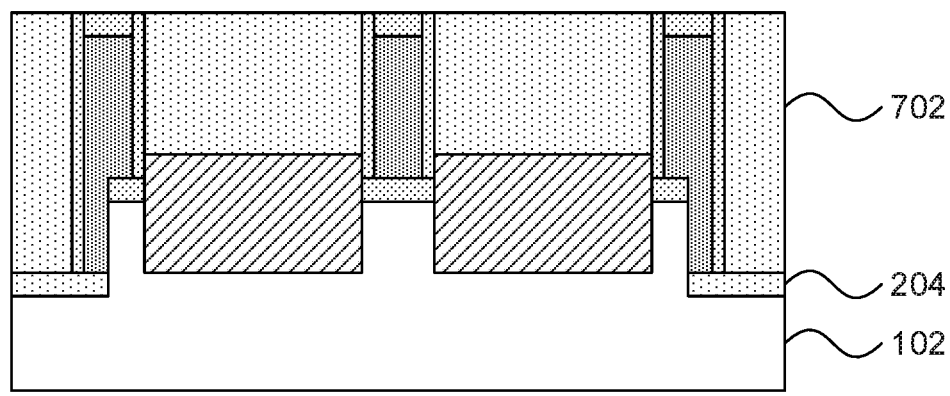
FIG. 7 is a view along cross-section A of a step in the fabrication of a gate all around finFETs where an interlayer dielectric is formed in accordance with an embodiment of the present invention.

Referring now to FIG. 7, a view along cross-section A of a step in the formation of gate-all-around finFETs is shown. An interlayer dielectric 702 is deposited over the structures and is then polished down to the level of the gate spacers 602 by any appropriate deposition process. For example, the interlayer dielectric 702 may be formed by, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

The material may then be polished down using, for example, chemical mechanical planarization (CMP). CMP is performed using, e.g., a chemical or granular slurry and mechanical force to gradually remove upper layers of the device. The slurry may be formulated to be unable to dissolve, for example, the gate spacer material, resulting in the CMP process's inability to proceed any farther than that layer.

Figure 8:
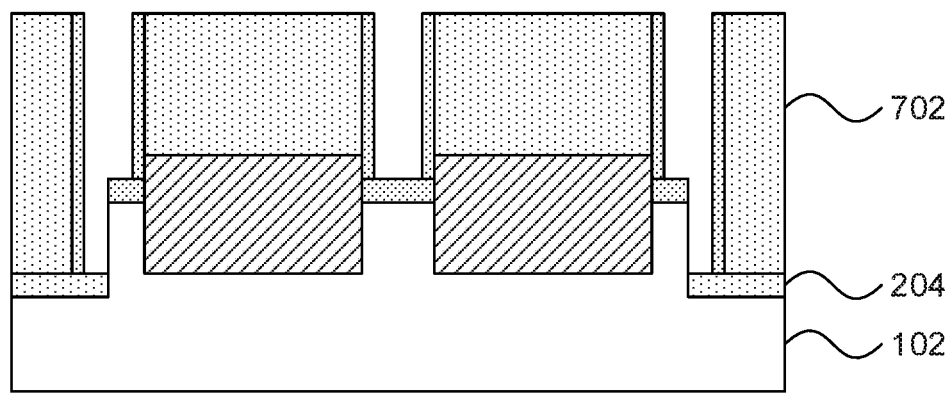
FIG. 8 is a view along cross-section A of a step in the fabrication of a gate all around finFETs where the dummy gates are removed in accordance with an embodiment of the present invention.

Referring now to FIG. 8, a view along cross-section A of a step in the formation of gate-all-around finFETs is shown. The dummy gate hardmasks 404 selectively and anisotropically etched away using, for example, RIE. The dummy gates 402 themselves may then be etched away by any appropriate etch, including an anisotropic RIE or an isotropic wet or dry chemical etch that selectively removes the dummy gate material without harming the material of the fins 202 or the source/drain regions 604.

Figure 9:
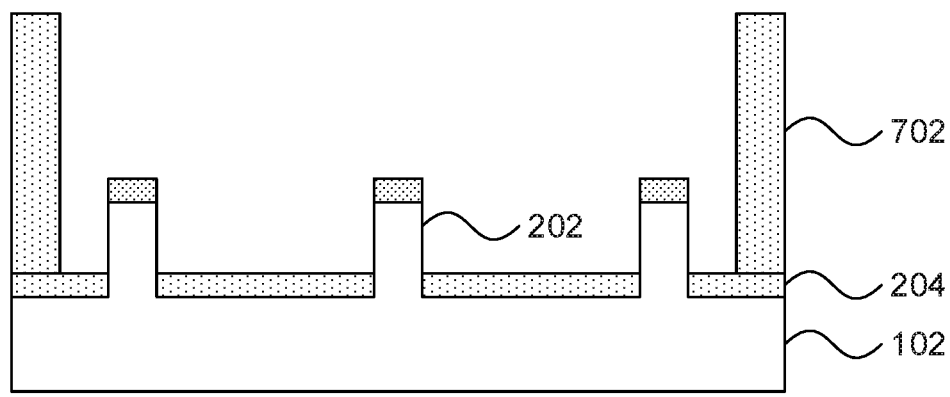
FIG. 9 is a view along cross-section B of a step in the fabrication of a gate all around finFETs where the dummy gates are removed in accordance with an embodiment of the present invention.

Referring now to FIG. 9, a view along cross-section B of a step in the formation of gate-all-around finFETs is shown. This view shows that the sidewalls of the fins 202 are exposed with the removal of the dummy gates 402.

Figure 10:
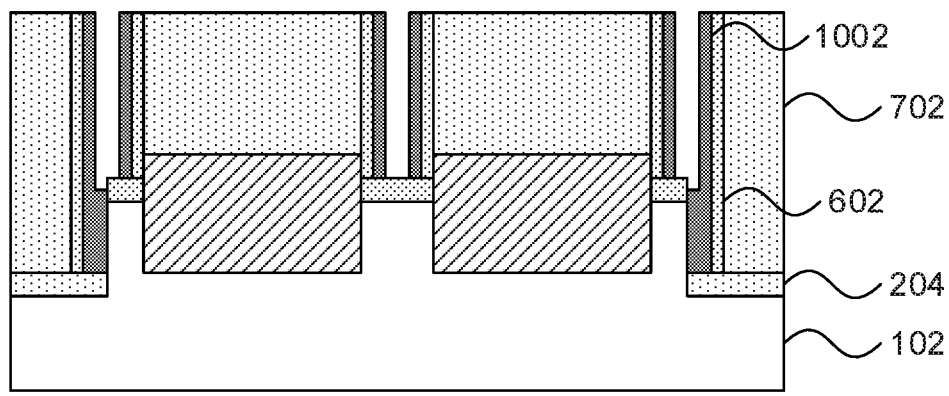
FIG. 10 is a view along cross-section A of a step in the fabrication of a gate all around finFETs where a second spacer is formed in accordance with an embodiment of the present invention.

Referring now to FIG. 10, a view along cross-section A of a step in the formation of gate-all-around finFETs is shown. Second spacers 1002 are formed on the exposed vertical surfaces by, for example, conformally depositing spacer material on all surfaces using, e.g., CVD or ALD, and then anisotropically etching down the material formed on the horizontal surfaces. It is specifically contemplated that the material of the second spacers 1002 should be selectively etchable relative to the material of the gate spacers 602, the interlayer dielectric 702, and the shallow trench isolation regions 204. Exemplary materials for the second spacers 1002 include, for example, amorphous carbon, silicocarbon boronitride, etc.

Figure 11:
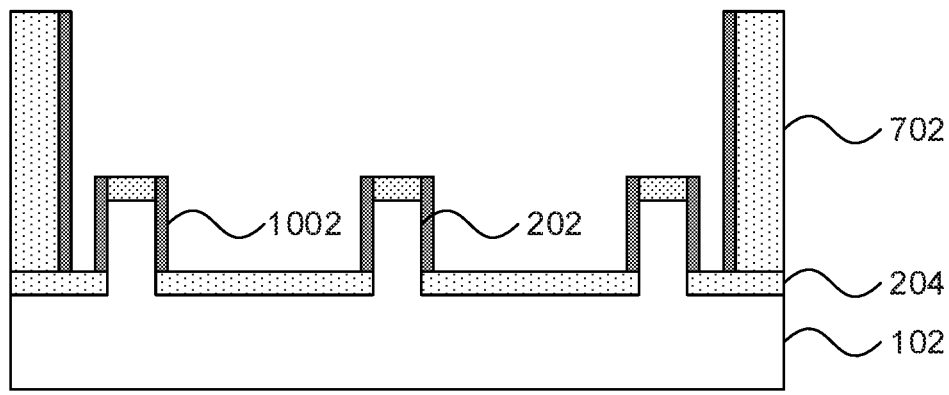
FIG. 11 is a view along cross-section B of a step in the fabrication of a gate all around finFETs where a second spacer is formed in accordance with an embodiment of the present invention.

Referring now to FIG. 11, a view along cross-section B of a step in the formation of gate-all-around finFETs is shown. The second spacers 1002 are shown as being deposited as well on the sidewalls of the fins 202. It should be noted that the sidewalls of the fins are covered by two separate structures: the second spacers 1002 and the shallow trench isolation material 204.

Figure 12:
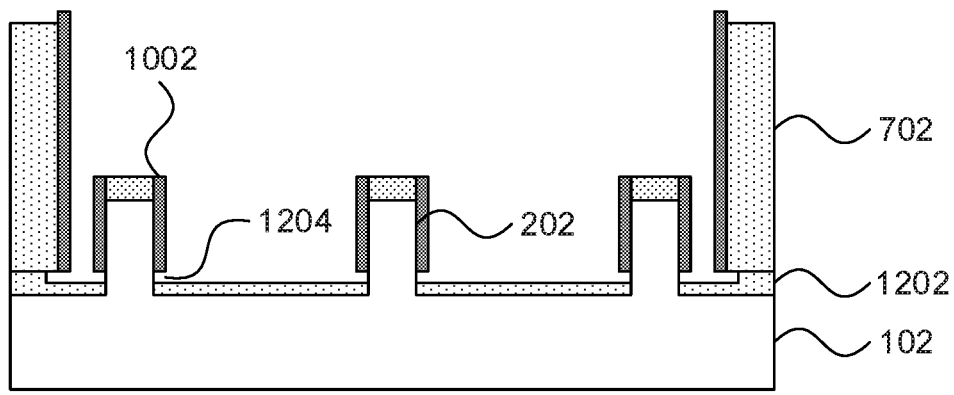
FIG. 12 is a view along cross-section B of a step in the fabrication of a gate all around finFETs where the shallow trench isolation region is etched back to expose a portion of the fin sidewalls in accordance with an embodiment of the present invention.

Referring now to FIG. 12, a view along cross-section B of a step in the formation of gate-all-around finFETs is shown. An isotropic etch is used to remove material from the shallow trench isolation region 204, producing recessed shallow trench isolation region 1202. In this particular embodiment, because it is contemplated that both the shallow trench isolation region 204 and the interlayer dielectric 702 may be formed from the same material (e.g., silicon dioxide), the interlayer dielectric 702 is also recessed in this etch to form recessed interlayer dielectric 1204. Because an isotropic etch is used, to a certain extent the etch will undercut the gate spacers 602 and the second spacers 1002. The recessed undercut 1204 is shown here exposing a portion of the sidewalls of the fins 202.

Figure 13:
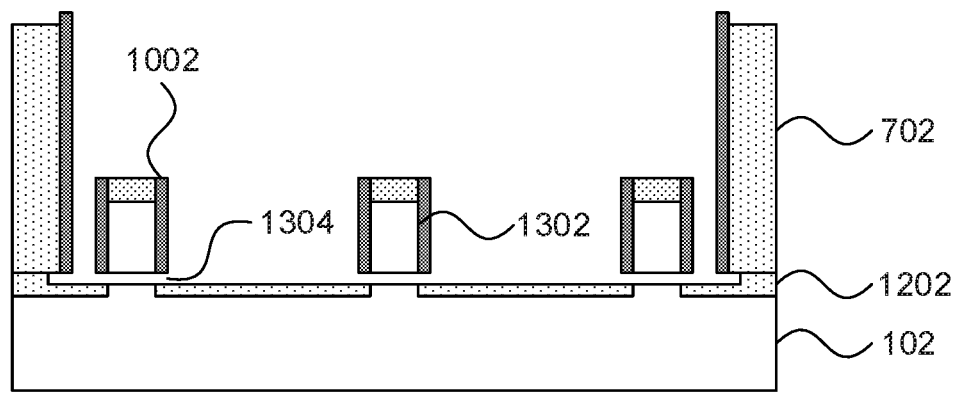
FIG. 13 is a view along cross-section B of a step in the fabrication of a gate all around finFETs where the fins are etched to separate them from the substrate in the channel region in accordance with an embodiment of the present invention.

Referring now to FIG. 13, a view along cross-section B of a step in the formation of gate-all-around finFETs is shown. An isotropic etch (e.g., a wet or dry chemical etch) is used to remove material from the fins 202 that is exposed by the recessed undercut 1204. This separates the fins 1302 from the substrate 102, leaving a gap 1304.

Figure 14:
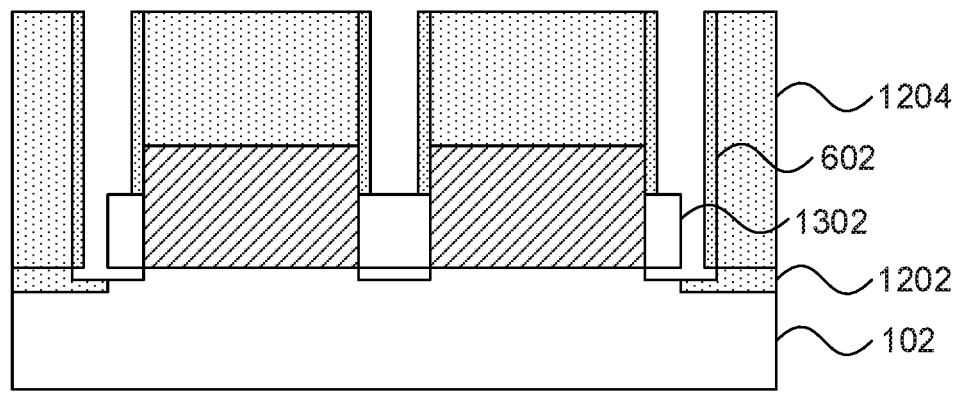
FIG. 14 is a view along cross-section A of a step in the fabrication of a gate all around finFETs where the second spacer is removed in accordance with an embodiment of the present invention.

Referring now to FIG. 14, a view along cross-section A of a step in the formation of gate-all-around finFETs is shown. The second spacers 1002 are etched away using an isotropic etch and the gate spacers 602 and fin hardmasks 104 are etched back using an anisotropic etch. The result of the anisotropic etch is the removal of the portions of the fin hardmasks 104 present on horizontal surfaces, thereby exposing the top of the separated fins 1302.

Figure 15:
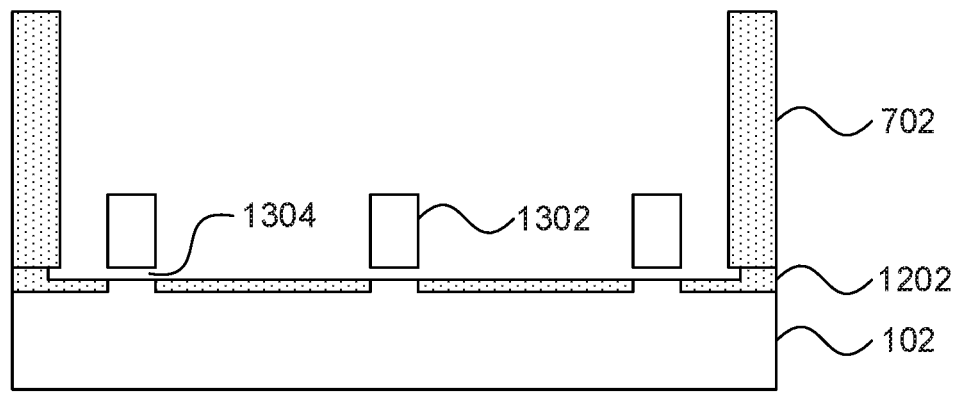
FIG. 15 is a view along cross-section B of a step in the fabrication of a gate all around finFETs where the second spacer is removed in accordance with an embodiment of the present invention.

Referring now to FIG. 15, a view along cross-section B of a step in the formation of gate-all-around finFETs is shown. The channel regions of the separated fins 1302 are shown as being entirely exposed.

Figure 16:
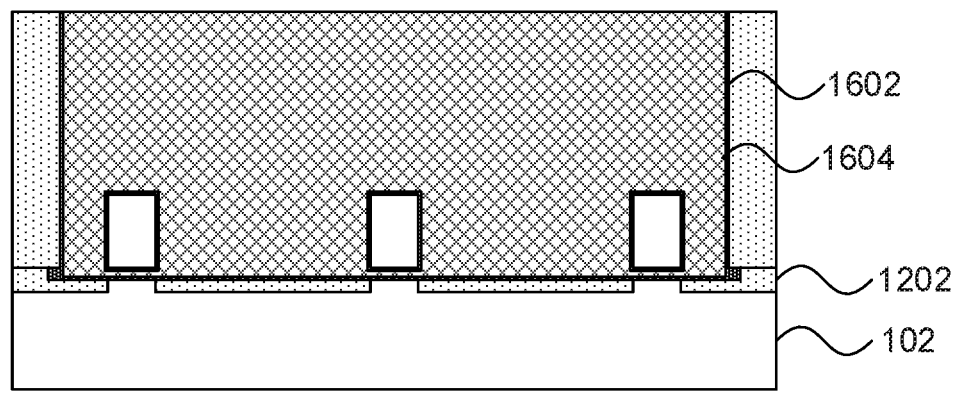
FIG. 16 is a view along cross-section B of a step in the fabrication of a gate all around finFETs where a gate stack is formed around the channel region of the fins in accordance with an embodiment of the present invention.

Referring now to FIG. 16, a view along cross-section B of a step in the formation of gate-all-around finFETs is shown. A gate stack is formed by conformally depositing a gate dielectric layer 1602 followed by a gate conductor 1604. It is specifically contemplated that the gate dielectric layer 1602 may be formed from a high-k dielectric material, although it should be understood that any dielectric material may be used instead. The gate conductor 1604 may be formed from any appropriate conductive material.

Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor 1604 may be formed from a conductive metal such as, e.g., tungsten, nickel, titanium, molybdenum, tantalum, copper, platinum, silver, gold, ruthenium, iridium, rhenium, rhodium, and alloys thereof. Other materials such as, e.g., doped polysilicon and semiconductor/metal alloys may be used as well. The gate conductor 1604 may further include an appropriate work function metal layer formed on the gate dielectric layer 1602 to tune the properties of the device.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not mended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 17:
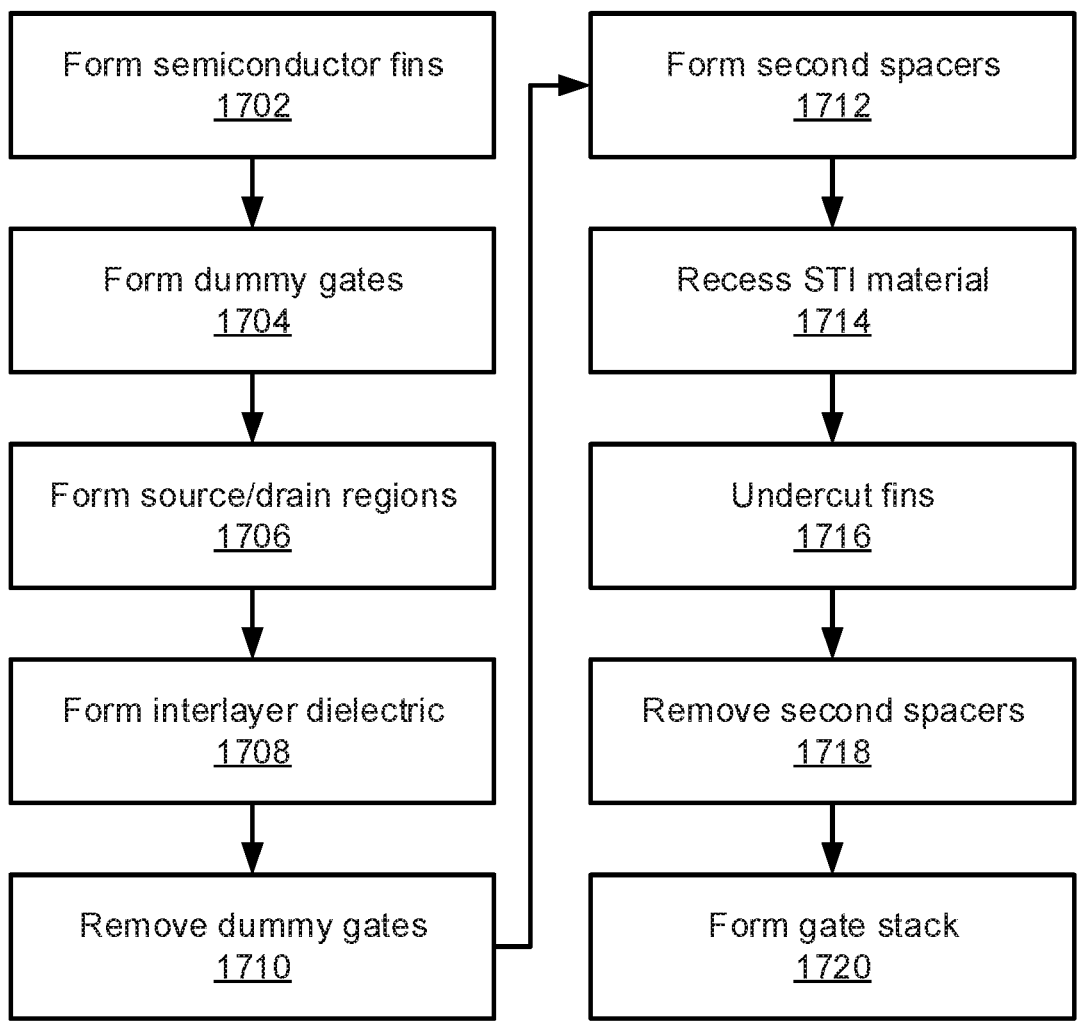
FIG. 17 is a block/flow diagram of a method of forming gate all around finFETs in accordance with an embodiment of the present invention.

Referring now to FIG. 17, a method of forming a gate all around finFET is shown. Block 1702 forms semiconductor fins 202 on a substrate 102. Block 1704 forms the dummy gates 402 across the semiconductor fins 202. Each of these structures may be formed by anisotropically etching a deposited material, for example using photolithographic processes or sidewall image transfer. Block 1706 forms gate spacers 602 and source and drain regions 604 on the exposed regions of the fins 202 and may do so using epitaxial growth with in situ doping or by performing ion implantation of dopants.

Block 1708 forms interlayer dielectric 702 around the fins 202 and the dummy gates 402 using, for example, silicon dioxide and a CVD, PVD, ALD, GCIP deposition, or spin-on deposition process. Block 1710 removes the dummy gates 402, etching away any remaining dummy gate hardmask followed by the dummy gate material itself, thereby exposing the channel region of the fins 202.

Block 1712 forms second spacers 1002 on the sidewalls of the fins 202. Block 1714 then recesses the shallow trench isolation material using an isotropic etch, such that a portion of the fins 202 is exposed at recessed undercut 1204. Block 1716 then undercuts the fins 202 themselves to produce suspended fins 1302 using a wet or dry isotropic chemical etch.

Block 1718 removes the second spacers 1002 to fully expose the channel regions of the suspended fins 1302. Block 1720 then forms a gate stack all around the suspended fins 1302. The gate stack includes a gate dielectric layer 1602 and a gate conductor 1604. At this stage, conductive contacts may be formed to the gate conductor 1604 and the source/drain regions 604 with any appropriate material to complete the device.

Having described preferred embodiments of a gate all around finFET (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    forming a dummy gate over a semiconductor fin;
    forming gate spacers on sidewalls of the dummy gate;
    forming a second dielectric layer on sidewalls of a channel region of a semiconductor fin and over the gate spacers, wherein the semiconductor fin is surrounded at a fin base by a first dielectric layer;
    recessing the first dielectric layer to expose a portion of a sidewall of the channel region of the semiconductor fin, between the recessed first dielectric layer and the second dielectric layer;
    etching away the exposed portion of the sidewall to separate the semiconductor fin from an underlying surface in the channel region; and
    forming a gate stack in the channel region that completely encircles the semiconductor fin.

2. The method of claim 1, wherein the gate spacers are formed from a material that is selectively etchable from a material of the second dielectric layer.

3. The method of claim 1, further comprising forming an interlayer dielectric around the semiconductor fin and the dummy gates after forming the gate spacers.

4. The method of claim 1, wherein recessing the first dielectric layer also undercuts the gate spacers.

5. The method of claim 1, further comprising forming source and drain regions on the semiconductor fin in areas not covered by the dummy gates.

6. The method of claim 1, wherein etching away material from the semiconductor fin comprises an isotropic wet or dry chemical etch.

7. The method of claim 1, wherein recessing the first dielectric layer leaves a reduced thickness dielectric layer around the semiconductor fin.

8. The method of claim 1, further comprising:
    etching a semiconductor substrate to form the semiconductor fin; and
    depositing a first dielectric material on a top surface of the substrate, around the semiconductor fin, to form the first dielectric layer.

9. The method of claim 1, wherein recessing the first dielectric layer partially removes material from the first dielectric layer, such that a portion of the first dielectric layer remains after recessing.

10. A method for forming a semiconductor device, comprising:
    forming a plurality of dummy gates across a semiconductor fin;
    forming gate spacers on sidewalls of the dummy gates;
    removing the dummy gates;
    forming a second dielectric layer on sidewalls of a channel region of a semiconductor fin, distinct from a source and drain region of the semiconductor fin, and on the gate spacers, wherein the semiconductor fin is surrounded at a fin base by a first dielectric layer;
    recessing the first dielectric layer to expose a portion of a sidewall of the channel region of the semiconductor fin between the recessed first dielectric layer and the second dielectric layer, thereby establishing a space between the first dielectric layer and the second dielectric layer along said sidewall;
    etching away the portion of the sidewall to separate the semiconductor fin from an underlying surface in the channel region; and
    forming a gate stack in the channel region that completely encircles the semiconductor fin.

11. The method of claim 10, wherein the gate spacers are formed from a material that is selectively etchable from a material of the second dielectric layer.

12. The method of claim 10, further comprising forming an interlayer dielectric around the semiconductor fin and the dummy gates after forming the gate spacers.

13. The method of claim 10, wherein recessing the first dielectric layer also undercuts the gate spacers.

14. The method of claim 10, wherein etching away material from the semiconductor fin comprises an isotropic wet or dry chemical etch.

15. The method of claim 10, further comprising forming source and drain regions on the semiconductor fin in areas not covered by the dummy gates.

16. The method of claim 10, wherein recessing the first dielectric layer leaves a reduced thickness dielectric layer around the semiconductor fin.

* * * * *